(12) United States Patent
Cho et al.

(10) Patent No.: US 11,430,955 B2
(45) Date of Patent: Aug. 30, 2022

(54) METHOD OF MANUFACTURING OXIDE SEMICONDUCTOR

(71) Applicant: Research & Business Foundation Sungkyunkwan University, Suwon-si (KR)

(72) Inventors: Hyungkoun Cho, Suwon-si (KR); Dongsu Kim, Suwon-si (KR); Youngdae Yun, Hwaseong-si (KR); Joosung Kim, Seongnam-si (KR)

(73) Assignee: Research & Business Foundation Sungkyunkwan University, Suwon-si (KR)

( * ) Notice: Subject to any disclaimer, the term of this patent is extended or adjusted under 35 U.S.C. 154(b) by 41 days.

(21) Appl. No.: 16/898,789

(22) Filed: Jun. 11, 2020

(65) Prior Publication Data
US 2021/0036224 A1 Feb. 4, 2021

(30) Foreign Application Priority Data

Jul. 31, 2019 (KR) .................. 10-2019-0092814

(51) Int. Cl.
*H01L 45/00* (2006.01)
*H01L 21/02* (2006.01)

(52) U.S. Cl.
CPC .... *H01L 45/1608* (2013.01); *H01L 21/02565* (2013.01); *H01L 21/02628* (2013.01); *H01L 45/06* (2013.01); *H01L 45/146* (2013.01)

(58) Field of Classification Search
CPC ... H01L 45/1608; H01L 45/06; H01L 45/146; H01L 21/02565; H01L 21/0262
See application file for complete search history.

(56) References Cited

U.S. PATENT DOCUMENTS

| | | | |
|---|---|---|---|
| 6,852,920 B2 * | 2/2005 | Sager | H01L 51/426 257/466 |
| 8,318,126 B2 * | 11/2012 | Wong | C01G 1/02 423/592.1 |
| 9,233,854 B2 * | 1/2016 | Jung | H01G 9/204 |
| 2012/0213994 A1 * | 8/2012 | Jafry | D01F 11/12 428/367 |

FOREIGN PATENT DOCUMENTS

| | | |
|---|---|---|
| KR | 10-2011-0027488 A | 3/2011 |
| KR | 10-2013-0024213 A | 3/2013 |
| KR | 10-2013-0103077 A | 9/2013 |
| KR | 10-1862072 B1 | 5/2018 |

OTHER PUBLICATIONS

Korean Office Action dated Jul. 30, 2020 in corresponding Korean Patent Application No. 10-2019-0092814 (5 pages in Korean).
Wang et al., "Electrodeposited copper oxide films: Effect of bath pH on grain orientation and orientation-dependent interfacial behavior," Elsevier, Oct. 18, 2006, pp. 3090-3095.

* cited by examiner

*Primary Examiner* — Dale E Page
*Assistant Examiner* — Quovaunda Jefferson
(74) *Attorney, Agent, or Firm* — NSIP Law

(57) ABSTRACT

A method of manufacturing an oxide semiconductor, includes impregnating a substrate in a solution containing a metal precursor and hydroxyl ions, and forming a metal oxide on the substrate by applying a voltage to the solution. The solution includes a surfactant, and the direction of crystal growth of the metal oxide is controllable based on the surfactant.

13 Claims, 15 Drawing Sheets
(5 of 15 Drawing Sheet(s) Filed in Color)

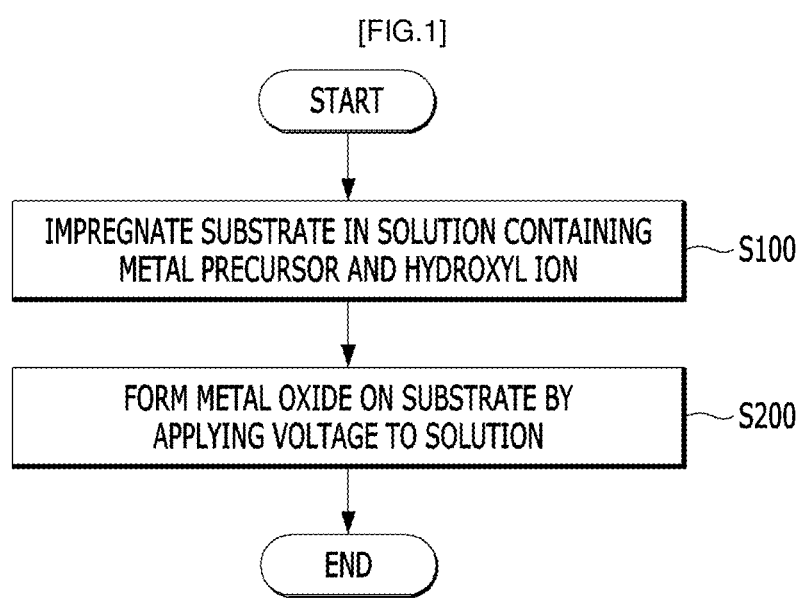

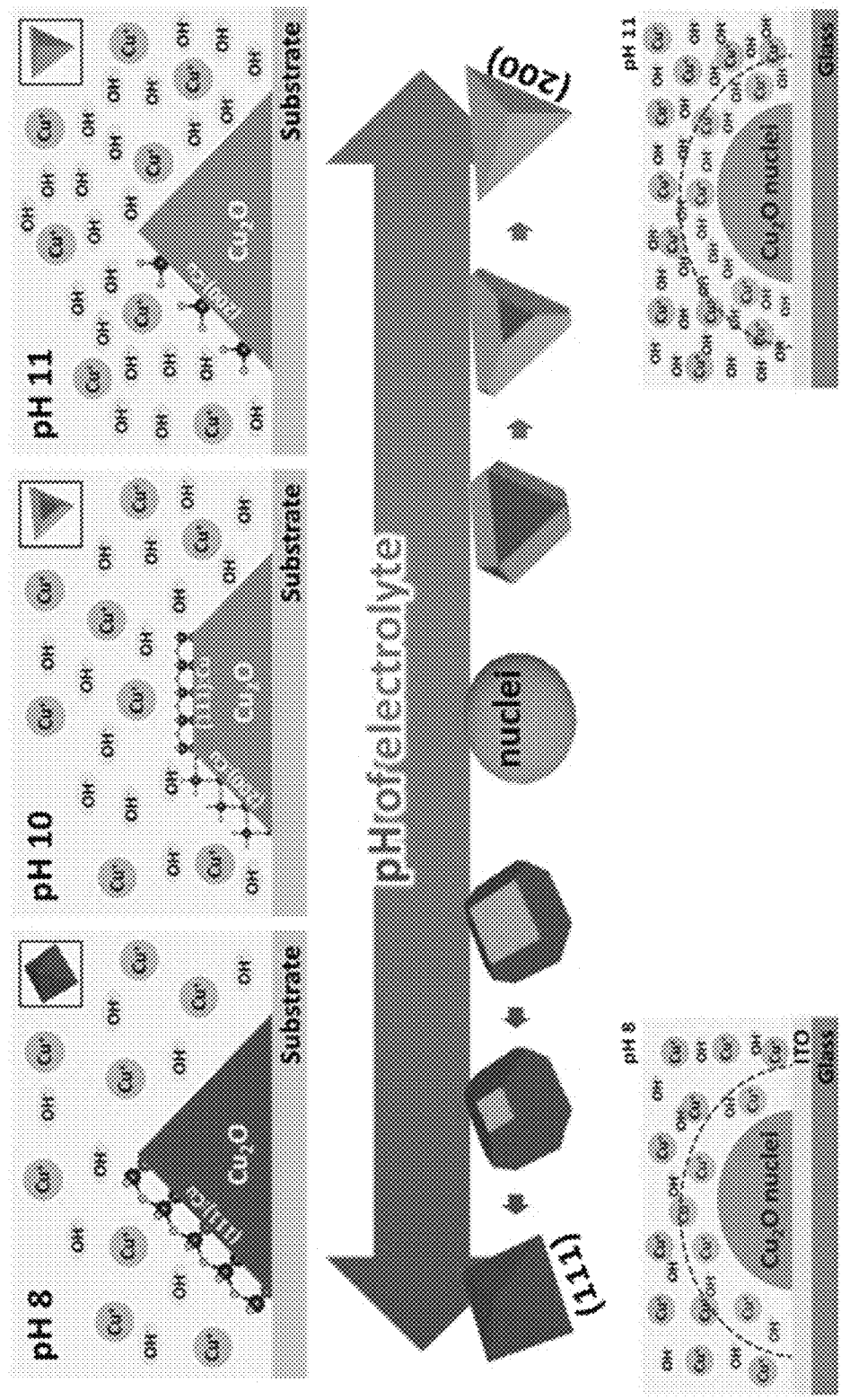
[FIG.2]

[FIG.3]
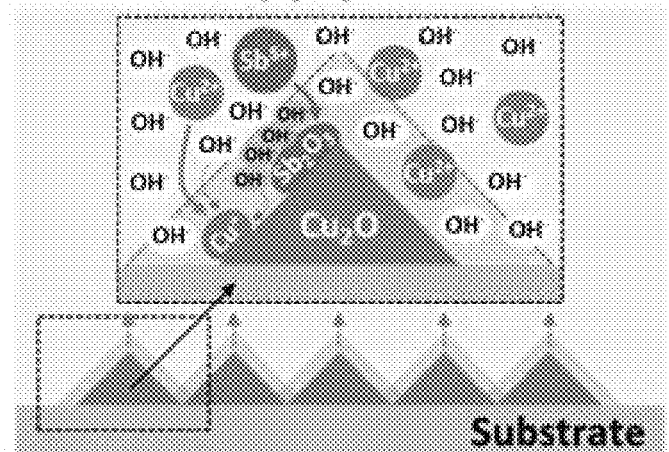
$$2Sb(OH)_6^- + 4e^- + H^+ \longrightarrow Sb_2O_3 + 4OH^- + 4H_2O$$
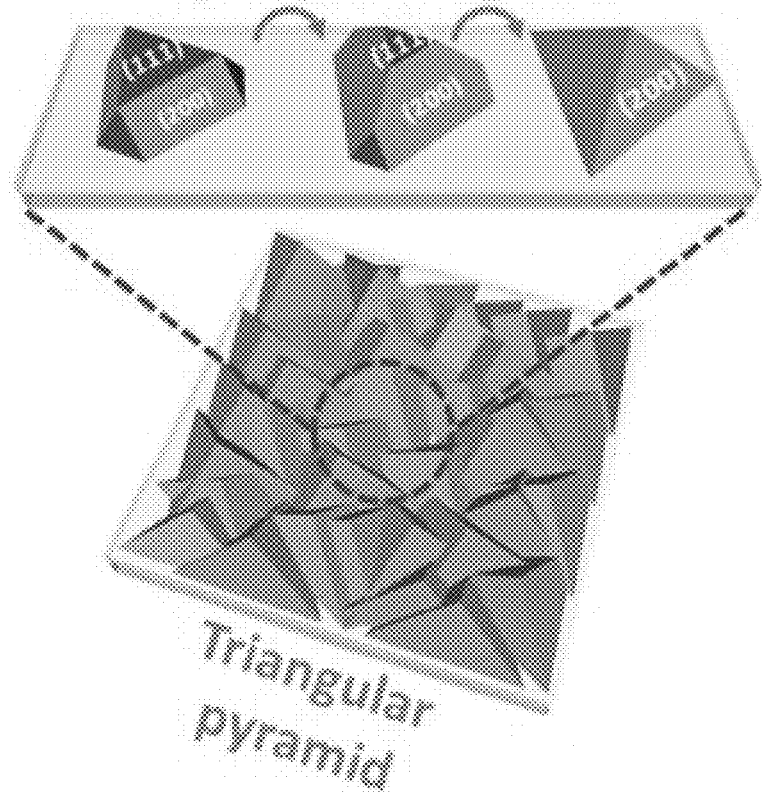

[FIG.4]
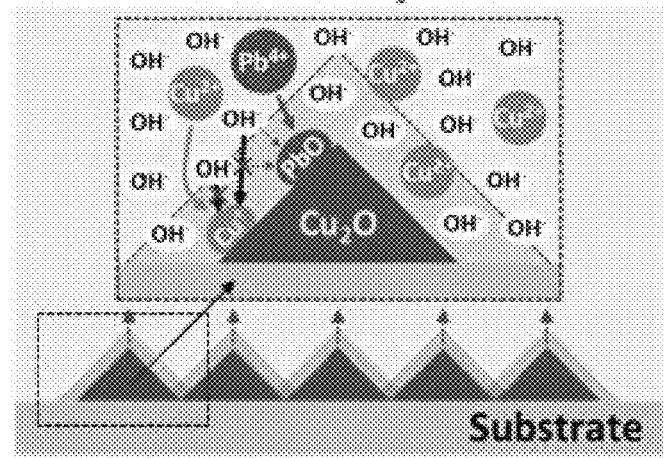
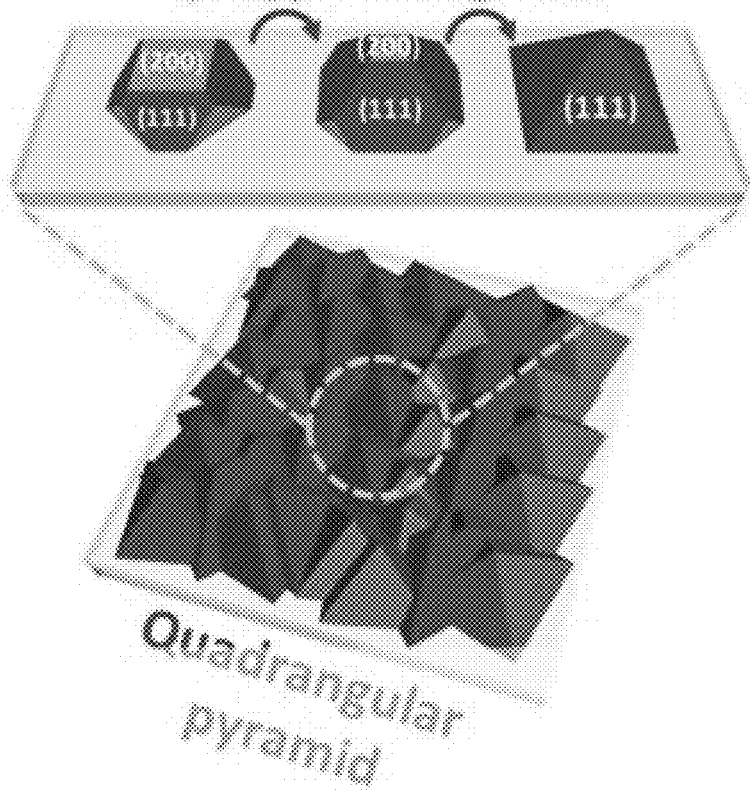

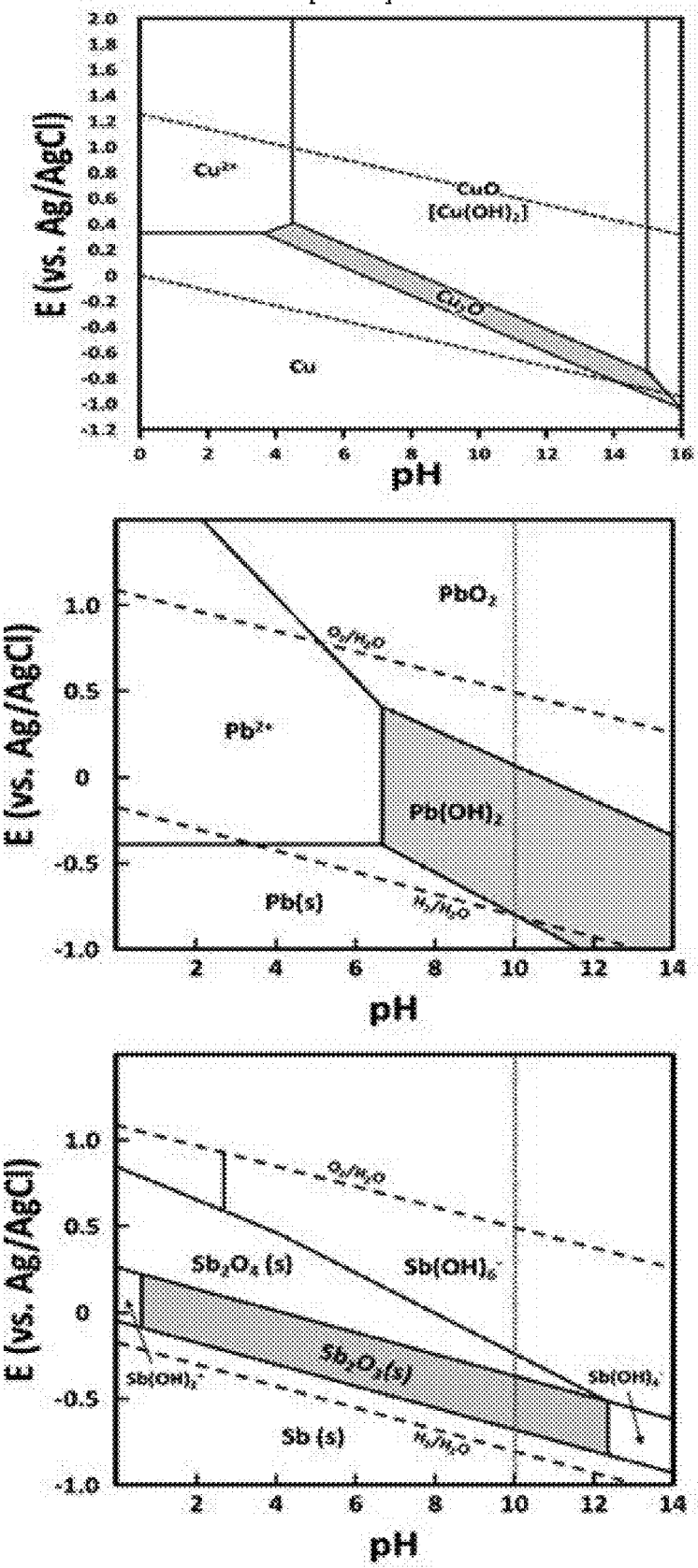

[FIG.6]
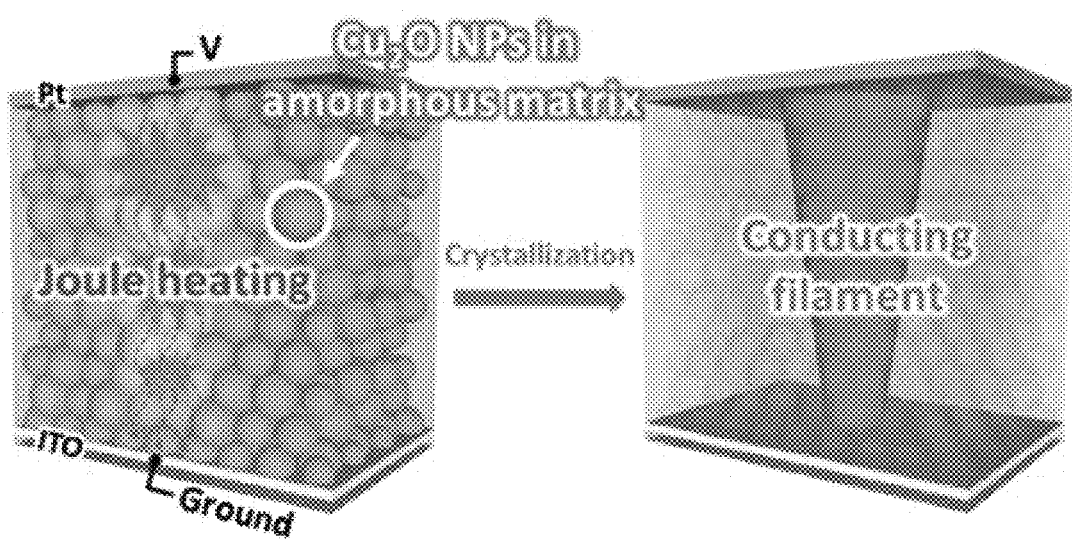

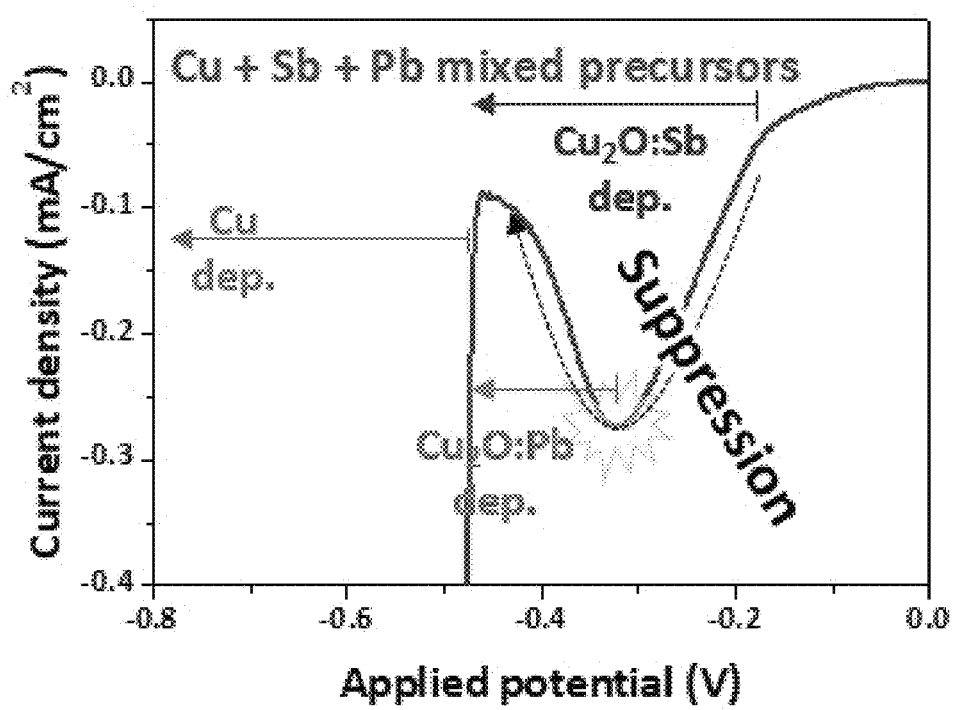

[FIG.8]
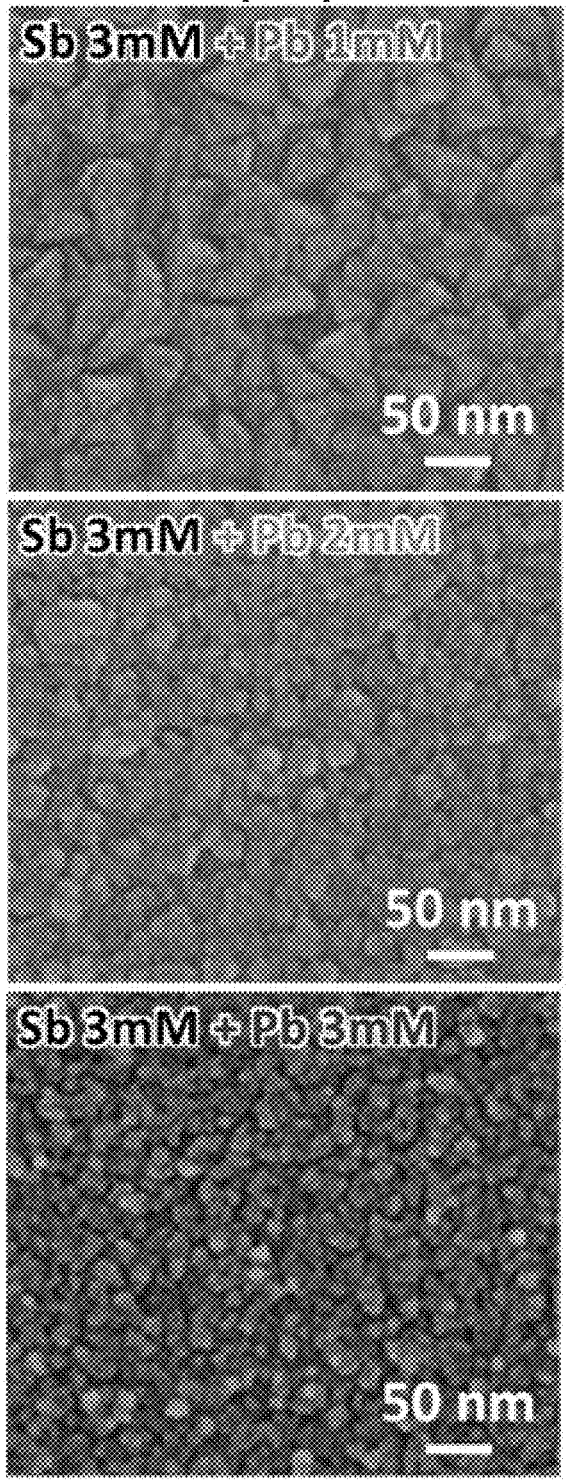

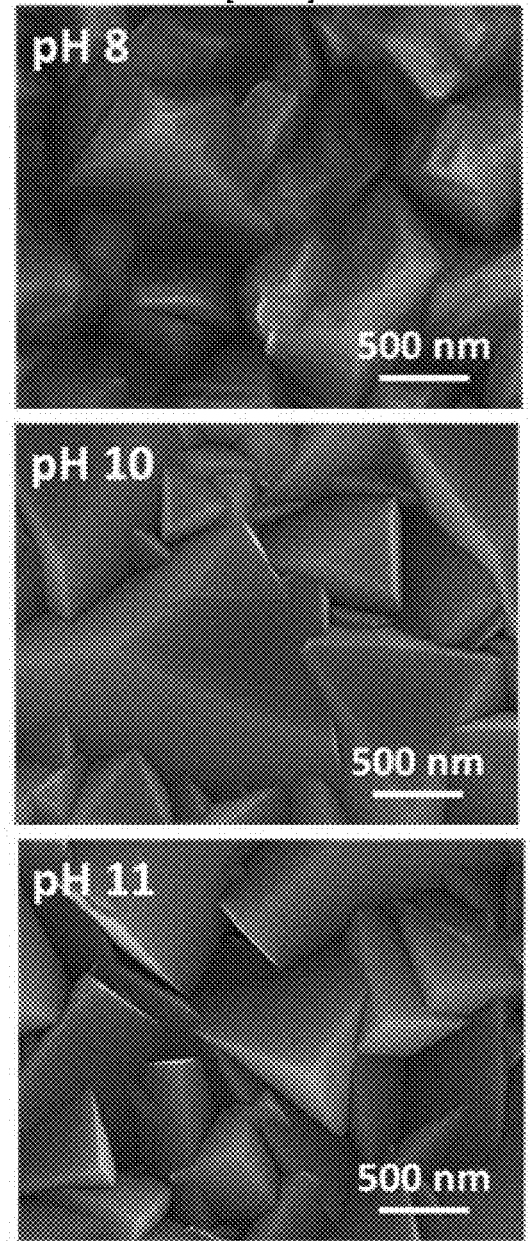
[FIG.9]

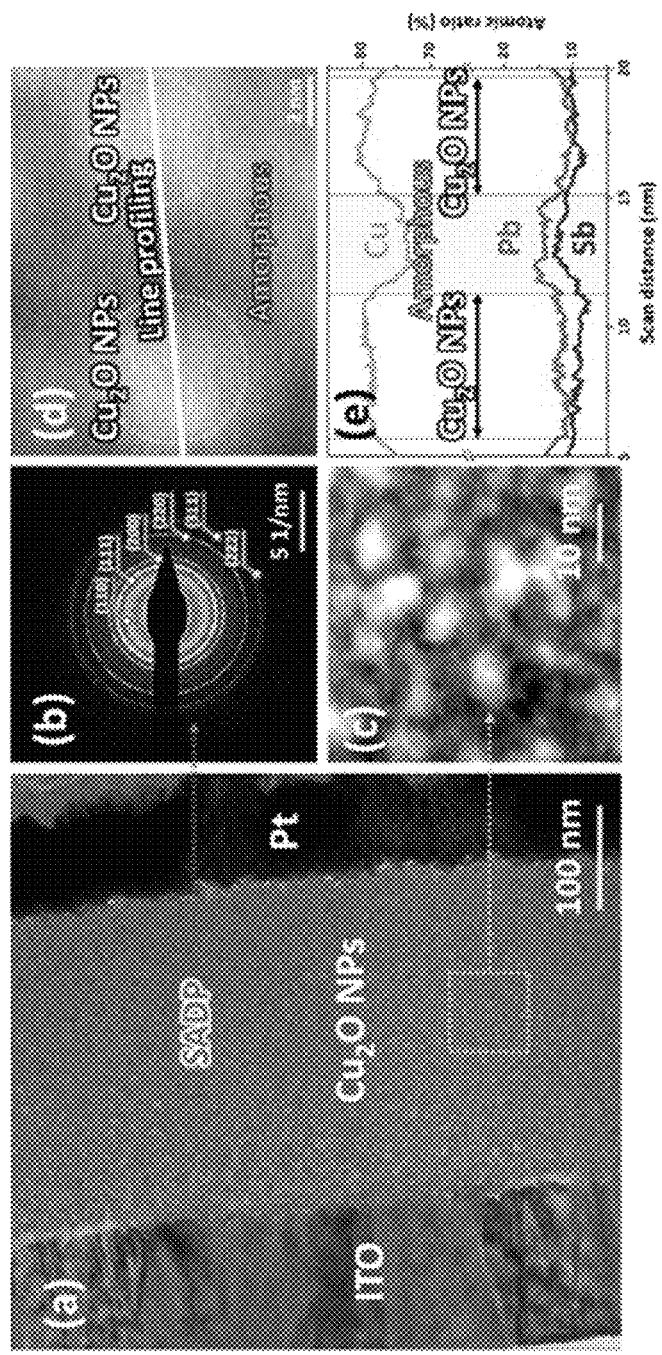
[FIG.10]

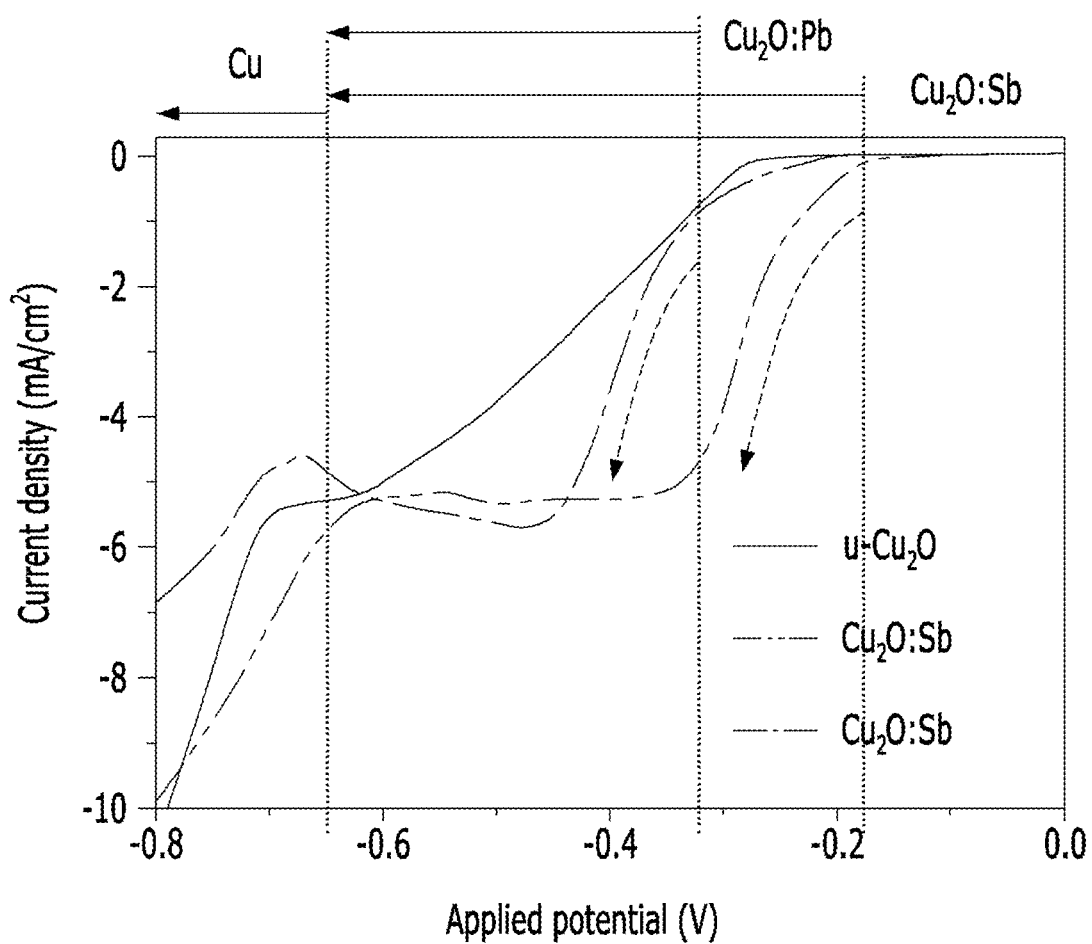
[FIG.11]

[FIG.12]
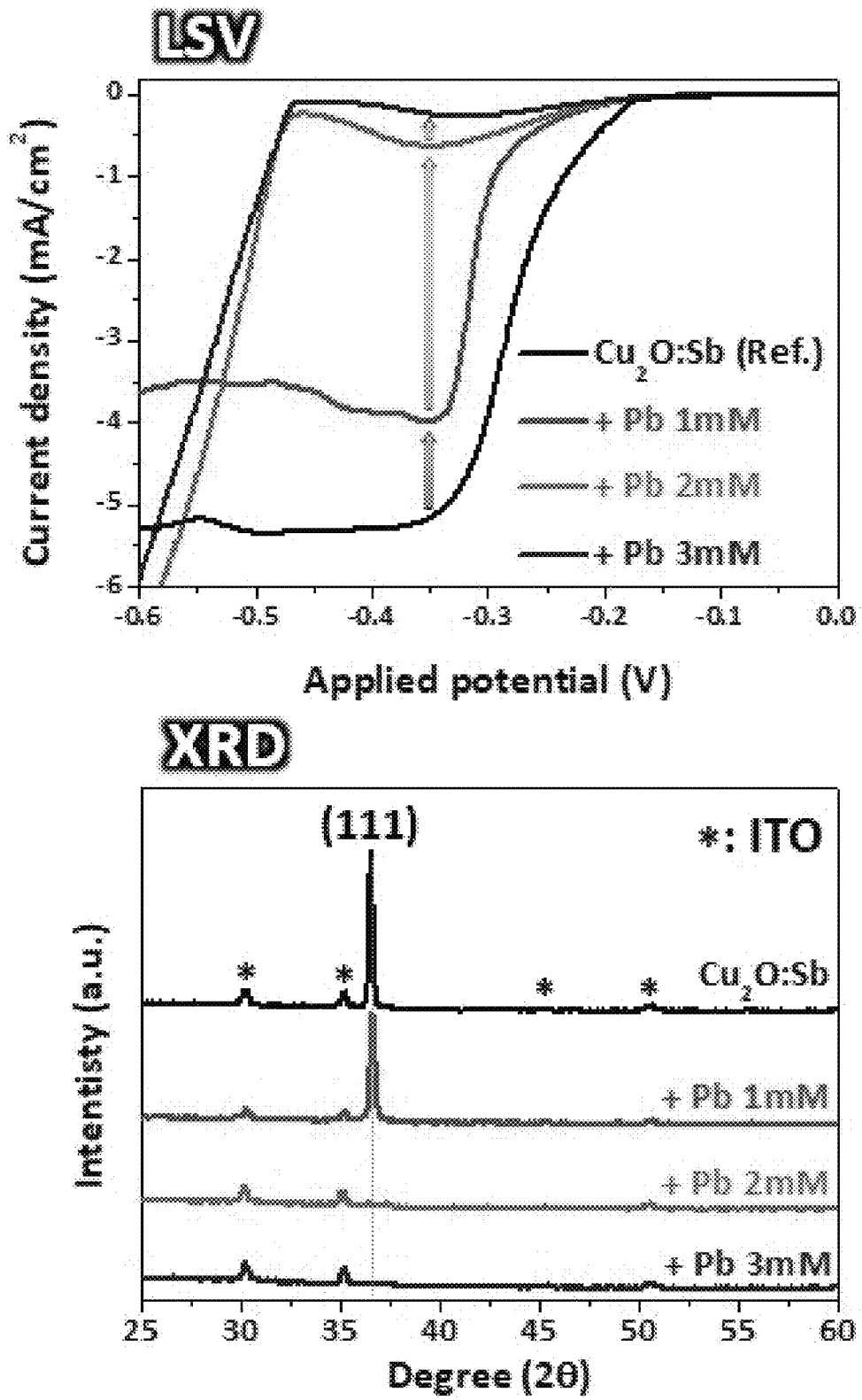

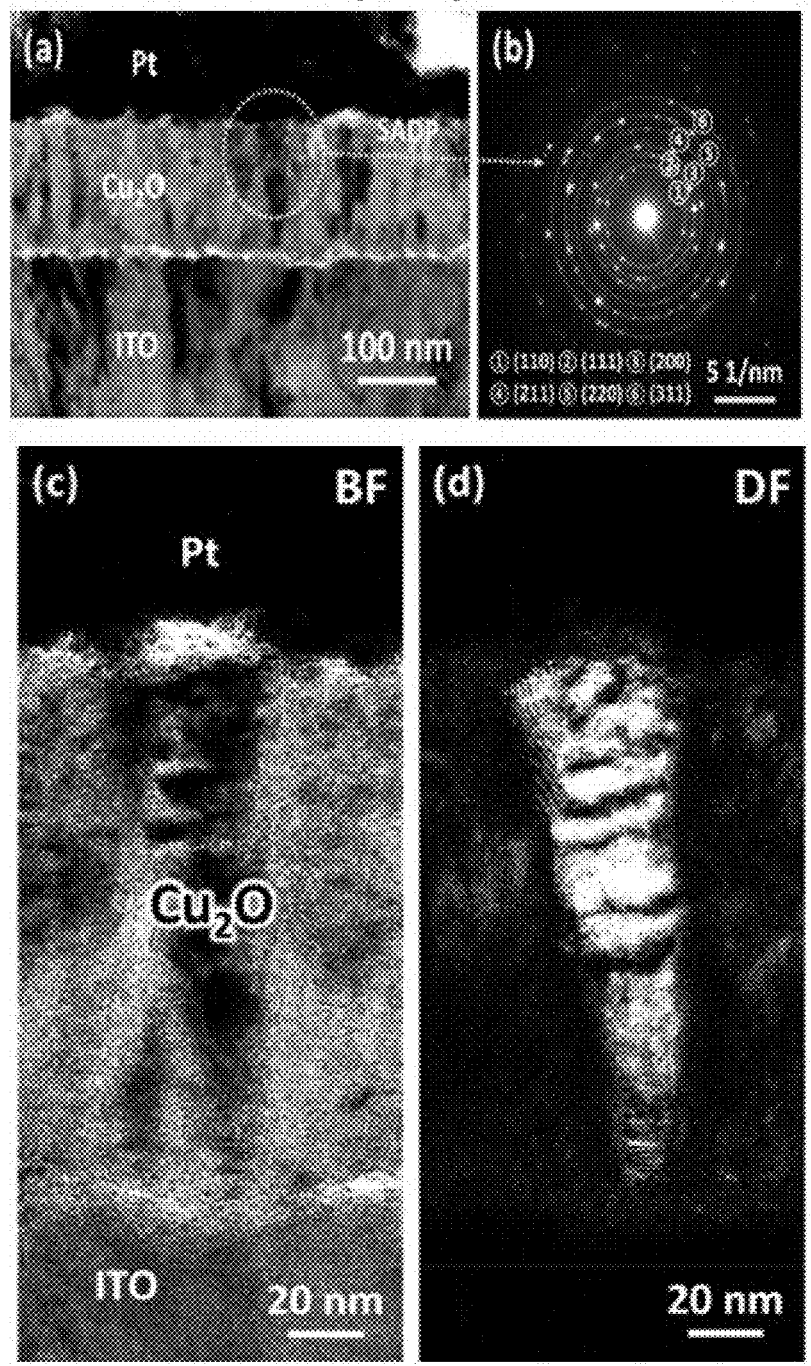
[FIG.13]

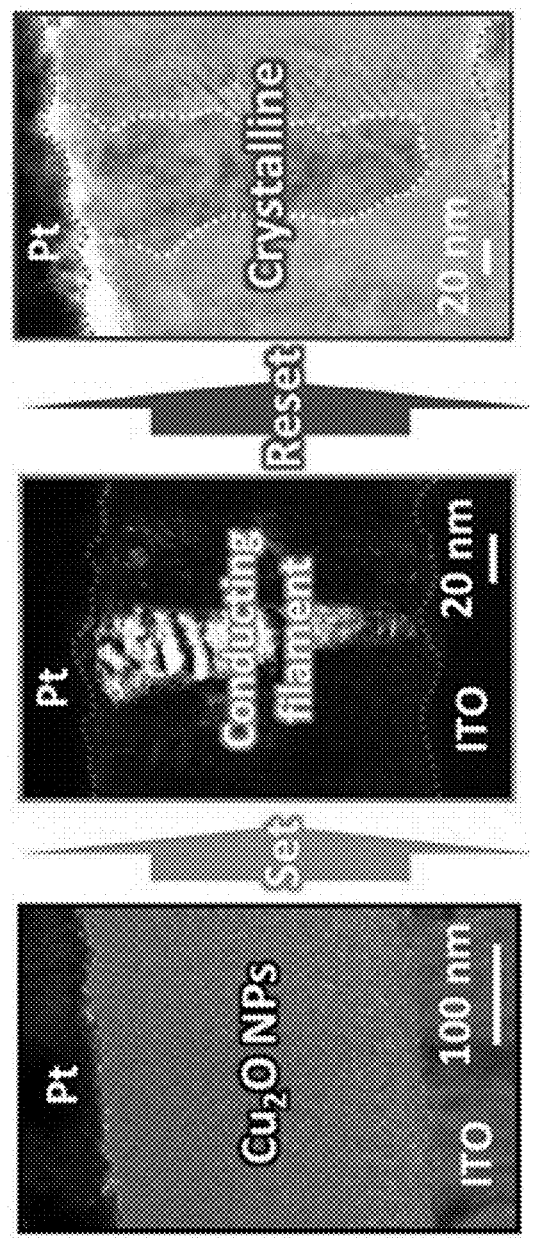
[FIG.14]

[FIG.15]
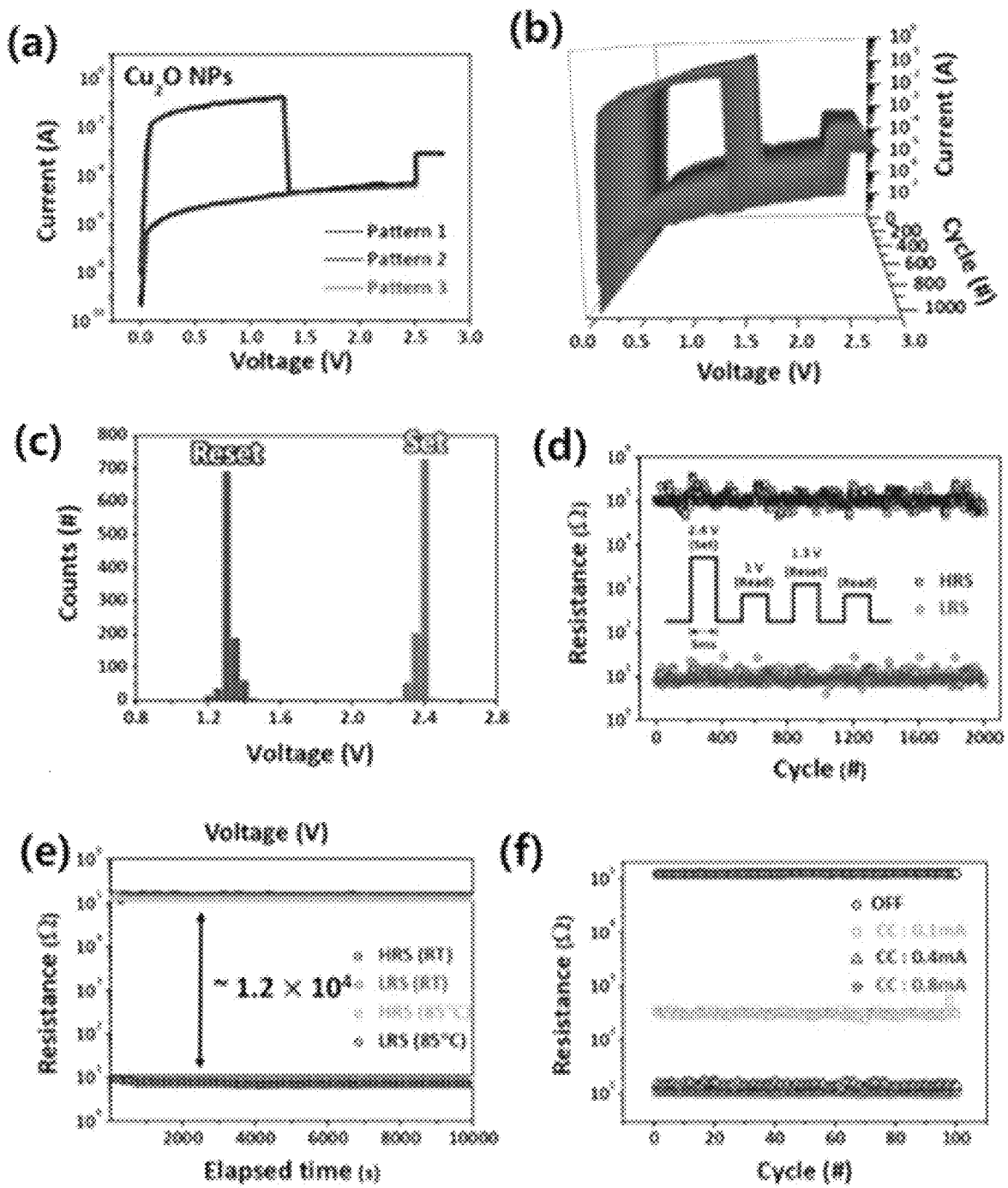

METHOD OF MANUFACTURING OXIDE SEMICONDUCTOR

CROSS-REFERENCE TO RELATED APPLICATION

This application claims the benefit under 35 USC 119(a) of Korean Patent Application No. 10-2019-0092814 filed on Jul. 31, 2019, in the Korean Intellectual Property Office, the entire disclosure of which is incorporated herein by reference for all purposes.

BACKGROUND

1. Field

The present disclosure relates to a method of manufacturing an oxide semiconductor.

2. Description of Related Art

Many attempts to achieve highly integrated volatile memories have failed due to their technological limitations. Accordingly, studies on new memories for replacing conventional volatile memories are being actively conducted. Non-volatile memories, in contrast to volatile memories, do not need to store charges to store information and thus have attracted a lot of attention from the academic and industrial communities.

Examples of non-volatile memories that are regarded as strong candidates for next-generation memories may include a phase-change RAM (PRAM), a nanofloating gate memory (NFGM), a resistive RAM (ReRAM), a polymer RAM (PoRAM), a magnetic RAM (MRAM), a molecular electronic device, and the like. Particularly, the ReRAM requires an easier manufacturing process and has higher switching speed and higher durability than the other devices and thus has been a promising candidate for next-generation non-volatile memory. Also, the PRAM reads and writes information using the reflectivity difference between the amorphous and crystalline states of phase-change materials and thus may have high operation speed and a high degree of integration.

Transition metal chalcogenides have been known as materials of next-generation non-volatile memory devices. However, it is difficult to control the composition of transition metal chalcogenides. Therefore, a method using copper oxide grown by an electrochemical process has been studied.

The copper oxide prepared by an electrochemical process has polycrystallinity, and various synthesis methods for removing defects and impurities have been studied, and, thus, the copper oxide has been used in high-efficiency solar cells or optoelectronic devices. However, in order to use the copper oxide in a ReRAM device, the number and size of grain boundaries observed from any part need to be uniform, and in order to use the copper oxide in a PRAM device, a heat transfer layer needs to be added. Therefore, the process becomes complicated.

The background technology of the present disclosure is disclosed in Korean Patent No. 10-1862072, which relates to a manufacturing method of a translucent thin film, a manufacturing method of an oxide semiconductor having absorptive characteristics of visible irradiation and an oxide semiconductor therefrom. This patent discloses a method of forming a copper oxide semiconductor by adding an Sb precursor, but does not disclose a method of forming a copper oxide semiconductor by adding Sb and Pb precursors together at the same time.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a method of manufacturing an oxide semiconductor, includes impregnating a substrate in a solution containing a metal precursor and hydroxyl ions, and forming a metal oxide on the substrate by applying a voltage to the solution. The solution includes a surfactant, and the direction of crystal growth of the metal oxide is controllable based on the surfactant.

The surfactant may supply or consume the hydroxyl ions depending on a pH of the solution and a level of the applied voltage.

A pH of the solution may be higher than 7.

The surfactant may include a metal selected from the group consisting of Sb, Pb, Ni, Cr, Co, Mn, and combinations thereof.

The surfactant may include two or more metals selected from the group consisting of Sb, Pb, Ni, Cr, Co, Mn, and combinations thereof.

The surfactant may include a first surfactant including at least one metal of Sb, Ni, or Cr and a second surfactant containing at least one metal of Pb, Co, or Mn.

The oxide semiconductor may include an amorphous metal oxide.

The surfactant may have a concentration of 1 mM to 5 mM.

The surfactant may include two or more metals of a same concentration.

The metal oxide may include a metal selected from the group consisting of Cu, Au, Pt, Ti, Ag, Ni, Zr, Ta, Zn, Nb, Cr, Co, Mn, Fe, Al, Mg, Si, W, and combinations thereof.

The solution may include $H_2O$ and a pH adjuster.

The applied voltage may be −0.2 V to −0.5 V.

The substrate may be a member selected from the group consisting of ITO, FTO, silicon, silicon carbide, germanium, silicon germanium, silicon carbide, InAs, AlAs, GaAs, InP, GaN, InGaAs, InAlAs, GaSb, AlSb, AlP, GaP, and combinations thereof.

The voltage may be applied through an electrode selected from the group consisting of Pt, Au, Ti, Ag, Ni, Zr, Ta, Zn, Nb, Cr, Co, Mn, Fe, Al, Mg, Si, W, Cu, lanthanide series metals, nitrides thereof, oxides thereof, conductive polymers, and combinations thereof.

In another general aspect, an oxide semiconductor including an oxide semiconductor is formed by impregnating a substrate in a solution containing a metal precursor and hydroxyl ions, and forming a metal oxide on the substrate by applying a voltage to the solution. The solution contains a surfactant, and the direction of crystal growth of the metal oxide is controllable based on the surfactant.

The surfactant may supply or consume the hydroxyl ions depending on a pH of the solution and a level of the applied voltage.

Other features and aspects will be apparent from the following detailed description, the drawings, and the claims.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

FIG. 1 is a flowchart showing a method of manufacturing an oxide semiconductor according to an embodiment of the present disclosure.

FIG. 2 illustrates a relationship between the pH of a solution and a metal oxide according to an embodiment of the present disclosure.

FIG. 3 illustrates the activity of a surfactant according to an embodiment of the present disclosure.

FIG. 4 illustrates the activity of a surfactant according to an embodiment of the present disclosure.

FIG. 5 shows Pourbaix diagrams of metal oxides and a surfactant according to an embodiment of the present disclosure.

FIG. 6 illustrates a process of change in resistance of an oxide semiconductor according to an embodiment of the present disclosure.

FIG. 7 is a graph showing a process of manufacturing an oxide semiconductor according to an example of the present disclosure.

FIG. 8 shows SEM images of an oxide semiconductor according to an example of the present disclosure.

FIG. 9 shows SEM images of oxide semiconductors according to comparative examples of the present disclosure.

(a) to (d) of FIG. 10 are TEM images of the oxide semiconductor according to the example of the present disclosure, and (e) of FIG. 10 shows EDX results of the oxide semiconductor according to the example of the present disclosure.

FIG. 11 shows LSV graphs of the oxide semiconductors according to the comparative examples of the present disclosure.

FIG. 12 shows LSV graphs and XRD diffraction patterns of the oxide semiconductors according to the example and the comparative examples of the present disclosure.

(a), (c), and (d) of FIG. 13 are TEM images of the oxide semiconductor according to the example of the present disclosure and (b) of FIG. 13 shows a diffraction pattern of the oxide semiconductor according to the example of the present disclosure.

FIG. 14 shows TEM images of the oxide semiconductor according to the example of the present disclosure.

(a) to (f) of FIG. 15 are graphs showing the electrical properties of the oxide semiconductor according to the example of the present disclosure.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after understanding of the disclosure of this application may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party. Through the whole document, the term "step of" does not mean "step for".

Through the whole document, the term "combination of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

A thin film included in a conventional oxide semiconductor is manufactured through a low-temperature electrochemical process. Thus, it has a certain crystallinity and is electrically non-uniform. Therefore, it is not suitable as an oxide semiconductor. However, in a method of manufacturing an oxide semiconductor according to the present disclosure, surfactants respectively containing different kinds of metals are mixed, and, thus, it is possible to manufacture an oxide semiconductor including an amorphous thin film in which nanoparticles are uniformly mixed.

Also, unlike multi-component chalcogenides used as a phase-change memory, the oxide semiconductor according to the present disclosure is grown through an electrochemical process, and, thus, the composition ratio thereof can be easily controlled.

Further, in a conventional phase-change memory, a phase change of a phase-change layer occurs reversibly by a heat transfer layer. However, in the oxide semiconductor according to the present disclosure, a phase change occurs by self-heating. Therefore, the method of manufacturing an oxide semiconductor according to the present disclosure can manufacture a device which is simple and greatly reduced in size as compared with a conventional method of manufacturing a phase-change memory.

Hereinafter, a method of manufacturing an oxide semiconductor of the present disclosure will be described in detail with reference to embodiments, examples, and drawings. However, the present disclosure is not limited to these embodiments, examples and drawings.

According to a first aspect of the present disclosure, there is provided a method of manufacturing an oxide semiconductor, including impregnating a substrate in a solution containing a metal precursor and hydroxyl ions, and forming a metal oxide on the substrate by applying a voltage to the solution, and the solution contains a surfactant and the direction of crystal growth of the metal oxide is controlled depending on the kind of the surfactant.

An oxide semiconductor according to the present disclosure refers to a material that contains a metal oxide and allows an electric current to flow when applied with a voltage equal to or more than a predetermined level but does not allow an electric current to flow when applied with a voltage equal to or less than the predetermined level.

A conventional oxide semiconductor manufactured through an electrochemical process has polycrystallinity and thus has high conductivity. However, a semiconductor material to be used in a ReRAM, which is a next-generation non-volatile memory, needs to be electrically uniform and also needs to be uniform in the number of grain boundaries throughout the entire area. Therefore, it is difficult to apply the conventional oxide semiconductor to the next-generation non-volatile memory. To overcome this problem, studies for reducing the size of crystal grains and the direction of crystal growth in the conventional oxide semiconductor by regulating the pH, temperature or voltage of an electrochemical growth solution have been conducted, but it is difficult to control the size of crystal grains by a conventional method of manufacturing an oxide semiconductor, and, thus, it is difficult to control the properties.

In the method of manufacturing an oxide semiconductor according to the present disclosure, a solution may contain at least two kinds of surfactants, and the method of manufacturing an oxide semiconductor can provide an oxide semiconductor in which the size of crystal grains and the direction of crystal growth are controlled.

FIG. 1 is a flowchart showing a method of manufacturing an oxide semiconductor according to an embodiment of the present disclosure.

In the method of manufacturing an oxide semiconductor according to the present disclosure, a substrate is impregnated in a solution containing a metal precursor and hydroxyl ions (S100).

According to an embodiment of the present disclosure, the pH of the solution may be higher than 7, but may not be limited thereto. For example, the pH of the solution may be higher than 7, 8, 9, 10, or 11, but may not be limited thereto. Herein, it is noted that use of the term 'may' with respect to an example or embodiment, e.g., as to what an example or embodiment may include or implement, means that at least one example or embodiment exists where such a feature is included or implemented while all examples and embodiments are not limited thereto.

As will be described below, the pH of the solution may be changed in a process of forming the metal oxide. However, the metal oxide is formed when the pH of the solution is from 8 to 12, and, thus, the method of manufacturing an oxide semiconductor according to the present disclosure is performed in an alkaline solution.

According to an embodiment of the present disclosure, the solution may contain a surfactant, but may not be limited thereto.

Typically, a surfactant refers to a material used to mix a polar solvent and a non-polar solvent. However, as will described below, the surfactant, according to the present disclosure, refers to a material that regulates the concentration of hydroxyl ions in the solution and thus controls the direction of crystal growth of the metal oxide.

According to an embodiment of the present disclosure, the solution may contain $H_2O$ and a pH adjuster, but may not be limited thereto. For example, the solution may contain $H_2O$, NaOH, and lactic acid, but may not be limited thereto.

The lactic acid, according to the present disclosure, serves as a stabilizer of copper ions by absorbing an alkaline aqueous solution and forming copper lactate ions as the complex of copper ions and lactate ions.

The NaOH, according to the present disclosure, serves to supply the hydroxyl ions to the solution in order for the pH of the solution to exceed 7.

According to an embodiment of the present disclosure, the metal oxide may contain a metal selected from the group consisting of Cu, Au, Pt, Ti, Ag, Ni, Zr, Ta, Zn, Nb, Cr, Co, Mn, Fe, Al, Mg, Si, W, and combinations thereof, but may not be limited thereto. Desirably, the metal precursor may contain Cu, but may not be limited thereto.

For example, the solution may be prepared by adding a metal precursor containing $CuSO_4$ and a pH adjuster containing lactic acid and NaOH to an $H_2O$ solvent and adding the surfactant to the solvent, but may not be limited thereto.

According to an embodiment of the present disclosure, the surfactant may contain a metal selected from the group consisting of Sb, Pb, Ni, Cr, Co, Mn, and combinations thereof, but may not be limited thereto.

According to an embodiment of the present disclosure, the surfactant may contain two or more kinds of metals, but may not be limited thereto.

According to an embodiment of the present disclosure, the surfactant may include a first surfactant containing at least one metal of Sb, Ni, or Cr and a second surfactant containing at least one metal of Pb, Co, or Mn, but may not be limited thereto.

For example, the solution may contain a material selected from the group consisting of $H_2O$, $CuSO_4$, lactic acid, NaOH, $Sb_2(SO_4)_3$, $Pb(C_2H_3O_2)_4$, and combinations thereof, but may not be limited thereto.

According to an embodiment of the present disclosure, the substrate may be a member selected from the group consisting of ITO, FTO, silicon, silicon carbide, germanium, silicon germanium, silicon carbide, InAs, AlAs, GaAs, InP, GaN, InGaAs, InAlAs, GaSb, AlSb, AlP, GaP, and combinations thereof, but may not be limited thereto.

Then, a metal oxide is formed on the substrate by applying a voltage to the solution (S200).

According to an embodiment of the present disclosure, the direction of crystal growth of the metal oxide may be changed depending on the pH of the solution, but may not be limited thereto.

FIG. 2 illustrates a relationship between the pH of a solution and a metal oxide according to an embodiment of the present disclosure.

Referring to FIG. 2, when the pH of a solution not containing a surfactant is 10, the metal oxide (for example, $Cu_2O$) grows in the (111) direction in the plane parallel to the substrate and grows in the (200) direction in the plane inclined to the substrate, and, thus, $Cu_2O$ may grow irregularly in the solution having a pH of 10.

However, when the solution has a pH of 8 or when the solution has a pH of 10 and Pb is used as the surfactant, the metal oxide may grow in the (200) direction and form a quadrangular pyramid shape in the (111) plane. Otherwise, when the solution has a pH of 11 or when the solution has a pH of 10 and Sb is used as the surfactant, the metal oxide may grow in the (111) direction and form a triangular pyramid shape in the (200) plane.

That is, the direction of crystal growth of the metal oxide may be controlled depending on the kind of the surfactant.

According to an embodiment of the present disclosure, the surfactant may supply or consume the hydroxyl ions depending on the pH of the solution and the level of the applied voltage, but may not be limited thereto.

According to an embodiment of the present disclosure, the first surfactant may make the metal precursor grow in the (111) direction and have the (200) plane, but may not be limited thereto.

According to an embodiment of the present disclosure, the first surfactant may supply the hydroxyl ions, but may not be limited thereto.

FIG. 3 illustrates the activity of a surfactant according to an embodiment of the present disclosure.

For example, referring to FIG. 2 and FIG. 3, if the first surfactant is $Sb(OH)_6^-$, the first surfactant may receive and react with hydrogen ions and electrons in the solution to produce $Sb_2O_3$ and hydroxyl ions. Further, the hydroxyl ions temporarily increase in the solution, and, thus, the $Cu_2O$, which is a metal oxide, may grow in the (111) direction and finally have a triangular pyramid shape of the (200) plane and the $Sb_2O_3$ may be formed on the surface of the $Cu_2O$.

According to an embodiment of the present disclosure, the second surfactant may make the metal precursor grow in the (200) direction and have the (111) plane, but may not be limited thereto.

According to an embodiment of the present disclosure, the second surfactant may consume the hydroxyl ions, but may not be limited thereto.

FIG. 4 illustrates the activity of a surfactant according to an embodiment of the present disclosure.

For example, referring to FIG. 2 and FIG. 4, if the second surfactant contains $Pb^{4+}$ ions, the $Pb^{4+}$ ions may be stabilized by binding to lactic acid in the solution and may receive electrons to become $Pb^{2+}$ ions and then react with hydroxyl ions present in the solution to produce PbO and $H_2O$ molecules. The hydroxyl ions temporarily decrease in the solution, and, thus, by supplying hydroxyl ions or suppressing the supply of hydroxyl ions, the $Cu_2O$, which is a metal oxide, may grow in the (200) direction and finally have a quadrangular pyramid shape of the (111) plane and the PbO may be formed on the surface of the $Cu_2O$.

Referring to FIG. 3 and FIG. 4, it can be seen that when any one of the first surfactant or the second surfactant is used alone to form an oxide semiconductor, a pyramid-shaped metal oxide is formed.

A material, for example, $Sb_2O_3$ or PbO, produced by the first surfactant or the second surfactant may form a diffusion layer.

The diffusion layer according to the present disclosure is formed on the surface of the oxide semiconductor by way of help when the first surfactant or the second surfactant reacts with electrons in the solution to directly form an oxide semiconductor. As will be described below, the diffusion layer is near an electrode when the oxide semiconductor is used.

According to an embodiment of the present disclosure, the oxide semiconductor may contain an amorphous metal oxide, but may not be limited thereto.

Specifically, the oxide semiconductor may be present in the form of nanoparticles dispersed on the amorphous metal oxide, but may not be limited thereto.

According to an embodiment of the present disclosure, the surfactant may have a concentration of from 1 mM to 5 mM, but may not be limited thereto. For example, the surfactant may have a concentration of from about 1 mM to about 5 mM, from about 2 mM to about 5 mM, from about 3 mM to about 5 mM, from about 4 mM to about 5 mM, from about 1 mM to about 4 mM, from about 1 mM to about 3 mM, from about 1 mM to about 2 mM, from about 2 mM to about 4 mM, or about 3 mM, but may not be limited thereto.

According to an embodiment of the present disclosure, the surfactant may contain two or more kinds of metals at the same concentration, but may not be limited thereto. For example, the first surfactant and the second surfactant may have the same concentration in the range of from about 1 mM to about 5 mM, from about 2 mM to about 5 mM, from about 3 mM to about 5 mM, from about 4 mM to about 5 mM, from about 1 mM to about 4 mM, from about 1 mM to about 3 mM, from about 1 mM to about 2 mM, from about 2 mM to about 4 mM, or about 3 mM, but may not be limited thereto.

For example, if a metal oxide is grown in a solution including the first surfactant having a concentration of 3 mM, the metal oxide may be grown into a triangular pyramid shape. However, if the solution, including the first surfactant having a concentration of 3 mM further contains the second surfactant, as the concentration of the second surfactant increases, the metal oxide may be formed into nanoparticles.

Herein, the metal oxide nanoparticles may be most densely formed when both the first surfactant and the second surfactant have a concentration of 3 mM.

According to an embodiment of the present disclosure, the metal oxide nanoparticles may be dispersed on the amorphous metal oxide, but may not be limited thereto.

According to an embodiment of the present disclosure, the applied voltage may be in the range of from −0.2 V to −0.5 V, but may not be limited thereto. For example, the applied voltage may be in the range of from about −0.2 V to about −0.5 V, from about −0.2 V to about −0.4 V, from about −0.2 V to about −0.3 V, from about −0.3 V to about −0.5 V, from about −0.4 V to about −0.5 V, or from about −0.3 V to about −0.4 V, but may not be limited thereto.

According to an embodiment of the present disclosure, the voltage may be applied through an electrode selected from the group consisting of Pt, Au, Ti, Ag, Ni, Zr, Ta, Zn, Nb, Cr, Co, Mn, Fe, Al, Mg, Si, W, Cu, lanthanide series metals, nitrides thereof, oxides thereof, conductive polymers, and combinations thereof, but may not be limited thereto.

FIG. 5 shows Pourbaix diagrams of metal oxides and a surfactant according to an embodiment of the present disclosure.

A Pourbaix diagram is a graph related to the phase of a compound and specifically, refers to a phase equilibrium diagram showing the phase of a material through the relationship between the pH of a solution containing a precursor of a compound and a potential applied to the solution.

Referring to FIG. 5, when water molecules and $Cu^{2+}$ ions react with each other in the solution, the $Cu^{2+}$ ions may produce $CuO$ and $Cu(OH)_2$, may be reduced to Cu or may produce $Cu_2O$ depending on the pH of the solution and a voltage applied to the solution. In this regard, under conditions where $Cu_2O$ can be produced, each of Sb or Pb is present in the form of $Sb_2O_3$ or $Pb(OH)_2$, respectively.

If the solution contains the surfactant to grow the $Cu_2O$, a metal contained in the surfactant reacts with hydroxyl ions or hydrogen ions to form a metal compound. The metal compound grows together with the $Cu_2O$ and adjusts the total pH of the solution and thus controls a preferential direction of the crystal growth of the $Cu_2O$.

However, the first surfactant and the second surfactant of the present disclosure adjusts the pH of a local site on the surface of an electrode to which a voltage is applied and thus make the $Cu_2O$ grow without uniform directionality and have nanoparticle form.

According to a second aspect of the present disclosure, there is provided an oxide semiconductor, including the oxide semiconductor manufactured according to the first aspect of the present disclosure.

Detailed descriptions of parts of the oxide semiconductor according to the second aspect of the present disclosure, which overlap with those of the first aspect of the present disclosure, are omitted hereinafter, but the descriptions of the first aspect of the present disclosure may be identically applied to the second aspect of the present disclosure, even though they are omitted hereinafter.

According to an embodiment of the present disclosure, the oxide semiconductor may contain amorphous metal oxide, including the metal oxide nanoparticles, but may not be limited thereto.

According to an embodiment of the present disclosure, when a voltage is applied to the oxide semiconductor, a conducting filament may be formed, but may not be limited thereto.

According to an embodiment of the present disclosure, the conducting filament may be formed by a phase change of the oxide semiconductor, but may not be limited thereto.

In general, a conducting filament refers to a path of an electric current to flow in a resistive RAM (ReRAM). Specifically, if a voltage equal to or more than a predetermined level is applied to the ReRAM, a path of electrons is formed by the movement of oxygen vacancies and metal ions or a local phase change on the ReRAM, and, thus, an electric current may flow in the ReRAM.

However, the conducting filament, according to the present disclosure, is formed by a phase change of a local site of the oxide semiconductor by spontaneous resistance heating and thus is differentiated from a conventional phase-change memory, including transition metal chalcogenides and a heat transfer layer.

FIG. 6 illustrates a process of change in resistance of an oxide semiconductor according to an embodiment of the present disclosure.

Referring to FIG. 6, when a voltage is applied to the oxide semiconductor (SET), a part of the oxide semiconductor is Joule heated by a resistance. Through the Joule heating, the amorphous metal oxide is crystallized along a direction of an electric field applied to the oxide semiconductor and the oxide semiconductor may include a conducting filament formed by the crystallized metal oxide.

Herein, if the direction of the electric field is reversed (RESET), the conducting filament disappears, and the oxide semiconductor may turn into the state before the voltage is applied, i.e., the metal oxide nanoparticles may become amorphous.

Hereinafter, the present disclosure will be described in more detail with reference to examples. The following examples are provided only for explanation, but do not intend to limit the scope of the present disclosure.

Example 1

An ITO substrate (15 Ω/sq to 20 Ω/sq) having a size of 20 mm×30 mm was impregnated in 0.4 M Copper sulfate anhydride ($CuSO_4$, Junsei, >98%) of which the pH was adjusted by 4 M NaOH aqueous solution (Sigma-Aldrich) and 3 M lactic acid aqueous solution (85%). Then, each of $Sb_2(SO_4)_3$ (Sigma-Aldrich, >95%) and $Pb(C_2H_3O_2)_4$ (Sigma-Aldrich, >95%) was added into the aqueous solution to be in the range of from 1 mM to 4 mM and a voltage of −0.45 V was added through an Ag/AgCl electrode to electrically deposit $Cu_2O$ on the substrate ($Cu_2O$:Sb/Pb).

FIG. 7 is a graph showing a process of manufacturing an oxide semiconductor according to an example of the present disclosure, and FIG. 8 shows SEM images of an oxide semiconductor according to an example of the present disclosure.

Referring to FIG. 7, it can be seen that when the ITO substrate was impregnated in the solution containing Cu, Sb, and Pb and a voltage was applied thereto, $Cu_2O$:Sb was formed at a voltage in the range of from −0.18 V to −0.36 V and $Cu_2O$:Pb was formed at a voltage in the range of from −0.36 V to −0.45 V, and Cu was formed at a voltage in the range of from −0.45 V to −0.48 V.

Referring to FIG. 8, it can be seen that when the concentration of the $Sb_2(SO_4)_3$ was 3 mM, as the concentration of the added $Pb(C_2H_3O_2)_4$ increased, the oxide semiconductor was formed into nanoparticles.

Comparative Example 1

$Cu_2O$ was electrically deposited in the same manner as in Example 1 except that $Sb_2(SO_4)_3$ and $Pb(C_2H_3O_2)_4$ were not added (u-$Cu_2O$).

Comparative Example 2

$Cu_2O$ was electrically deposited in the same manner as in Example 1 except that $Sb_2(SO_4)_3$ was not added ($Cu_2O$:Pb).

Comparative Example 3

$Cu_2O$ was electrically deposited in the same manner as in Example 1 except that $Pb(C_2H_3O_2)_4$ was not added ($Cu_2O$:Sb).

FIG. 9 shows SEM images of oxide semiconductors according to the comparative examples 1 to 3.

Referring to FIG. 9, it can be seen that unlike the oxide semiconductor when the pH was 10 (Comparative Example 1), the oxide semiconductor when the pH was 8 (Comparative Example 2) had a quadrangular pyramid shape and the oxide semiconductor when the pH was 11 (Comparative Example 3) had a triangular pyramid shape.

Test Example 1

(a) to (d) of FIG. 10 are TEM images of the oxide semiconductor according to the example, and (e) of FIG. 10 shows EDX results of the oxide semiconductor according to the example.

Referring to (a) to (d) of FIG. 10, the oxide semiconductor contains $Cu_2O$ nanoparticles and thus may have an XRD diffraction pattern with (110), (111), (200) and the like. Also, referring to (e) of FIG. 10, the atomic ratio of cations of the oxide semiconductor can be found.

Test Example 2

FIG. 11 shows LSV graphs of the oxide semiconductors according to the comparative examples of the present disclosure.

Referring to FIG. 11, when a voltage in the range of from −0.3 V to −0.5 V was applied to Cu2O:Pb and Cu2O:Sb, a current density sharply increased, and it can be seen that where the effect of the metal precursor started. Also, it can be seen that the oxide semiconductor using crystalline $Cu_2O$:Pb or $Cu_2O$:Sb whose grain boundaries are difficult to control is not suitable as an ReRAM.

FIG. 12 shows LSV graphs and XRD diffraction patterns of the oxide semiconductors according to the example and the comparative examples of the present disclosure.

Referring to FIG. 12, it can be seen that the material of Example 1 shows a linear increase in current density in the range of from −0.2 V to −0.35 V due to the Sb precursor and a decrease in current density in the range of from −0.35 V to −0.45 V due to the Pb precursor, which means complementary growth occurs. Also, it can be seen that the (111) pattern observed from the material of Comparative Example 3 is not observed from the material of Example 1 and no peak other than those of ITO is observed, which means the material of Example 1 is amorphous.

Test Example 3

(a), (c), and (d) of FIG. 13 and FIG. 14 are TEM images of the oxide semiconductor according to the example of the present disclosure, and (b) of FIG. 13 shows a diffraction pattern of the oxide semiconductor according to the example of the present disclosure.

Referring to (a), (c), and (d) of FIG. 13 and FIG. 14, the oxide semiconductor may be located between a Pt electrode and an ITO substrate (transparent electrode). In this case, if a high voltage is applied to $Cu_2O$ nanoparticles on the oxide semiconductor (Set), the amorphous $Cu_2O$ nanoparticles form a crystallized conducting filament by resistance heating, which results in a decrease in resistance. If a low voltage is applied to an area where the crystallized conducting filament is present (Reset), a high electric current flows so that the conducting filament becomes amorphous due to Joule heating and resistance of the oxide semiconductor increases. Therefore, the resistance of the oxide semiconductor may be changed by a phase change in a local site.

Test Example 4

(a) to (f) of FIG. 15 are graphs showing the electrical properties of the oxide semiconductor according to the example of the present disclosure. Specifically, (a) of FIG. 15 shows the uniformity of each pattern and (b) of FIG. 15 shows the stability of continuous change in voltage. (c) of FIG. 15C shows a difference between Set and Reset voltages and (d) of FIG. 15 shows the stability of a device depending on a pulse change in voltage. (e) of FIG. 15 shows the thermal stability of a device and (f) of FIG. 15 shows that the possibility of multi-bit storage and the degree of integration resulted from the multi-level of a device can be increased depending on a limiting current change of Set.

Referring to FIG. 15, it can be seen that the oxide semiconductor containing the $Cu_2O$ nanoparticles is set in the range of from 2.2 V to 2.4 V and reset in the range of from 1.2 V to 1.5 V, and even if the oxide semiconductor is set and repeatedly reset 1000 times, for example, the electric current depending on the applied voltage is uniform, and the effect of the oxide semiconductor on resistance is insignificant.

To sum up, the oxide semiconductor, according to the present disclosure, is not significantly affected by temperature and set-reset cycle, and a set voltage is remarkably differentiated from a reset voltage. Also, the oxide semiconductor is changed in resistance by a phase change of $Cu_2O$ nanoparticles into a conducting filament and thus can be used as a phase-change memory or a ReRAM.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

We claim:

1. A method of manufacturing an oxide semiconductor, the method comprising:
   impregnating a substrate in a solution containing a metal precursor and hydroxyl ions; and
   forming a metal oxide on the substrate by applying a voltage to the solution,
   wherein the solution comprises a surfactant, and a direction of crystal growth of the metal oxide is controllable based on the surfactant, and
   wherein the surfactant comprises a metal selected from the group consisting of Sb, Pb, Ni, Cr, Co, Mn, and combinations thereof.

2. The method of claim 1, wherein the surfactant supplies or consumes the hydroxyl ions depending on a pH of the solution and a level of the applied voltage.

3. The method of claim 1, wherein a pH of the solution is higher than 7.

4. The method of claim 1, wherein the surfactant comprises two or more metals selected from the group consisting of Sb, Pb, Ni, Cr, Co, Mn, and combinations thereof.

5. The method of claim 4, wherein the surfactant comprises a first surfactant comprising at least one metal selected from the group consisting of Sb, Ni, and Cr and a second surfactant comprising at least one metal selected from the group consisting of Pb, Co, and Mn.

6. The method of claim 5, wherein the oxide semiconductor comprises an amorphous metal oxide.

7. The method of claim 4, wherein the surfactant comprises two or more metals of a same concentration.

8. The method of claim 1, wherein the surfactant has a concentration of 1 mM to 5 mM.

9. The method of claim 1, wherein the metal oxide comprises a metal selected from the group consisting of Cu, Au, Pt, Ti, Ag, Ni, Zr, Ta, Zn, Nb, Cr, Co, Mn, Fe, Al, Mg, Si, W, and combinations thereof.

10. The method of claim 1, wherein the solution further comprises $H_2O$ and a pH adjuster.

11. The method of claim 1, wherein the applied voltage is −0.2 V to −0.5 V.

12. The method of claim 1, wherein the substrate is selected from the group consisting of ITO, FTO, silicon, silicon carbide, germanium, silicon germanium, silicon carbide, InAs, AlAs, GaAs, InP, GaN, InGaAs, InAlAs, GaSb, AlSb, AlP, GaP, and combinations thereof.

13. The method of claim 1, wherein the voltage is applied through an electrode selected from the group consisting of Pt, Au, Ti, Ag, Ni, Zr, Ta, Zn, Nb, Cr, Co, Mn, Fe, Al, Mg, Si, W, Cu, lanthanide series metals, nitrides thereof, oxides thereof, conductive polymers, and combinations thereof.

* * * * *